(12) United States Patent
Jackson et al.

(10) Patent No.: US 8,420,433 B2
(45) Date of Patent: Apr. 16, 2013

(54) TILED LIGHT SENSING ARRAY

(75) Inventors: John Carlton Jackson, Cork (IE);
Padraig Joseph Hughes, Cork (IE);
Peter John Ward, Oundle (GB)

(73) Assignee: SensL Technologies, Ltd., Blackrock, Cork (IE)

( * ) Notice: Subject to any disclaimer, the term of this patent is extended or adjusted under 35 U.S.C. 154(b) by 381 days.

(21) Appl. No.: 12/671,425

(22) PCT Filed: Jul. 30, 2008

(86) PCT No.: PCT/GB2008/050641
§ 371 (c)(1),
(2), (4) Date: Jun. 23, 2010

(87) PCT Pub. No.: WO2009/016407
PCT Pub. Date: Feb. 5, 2009

(65) Prior Publication Data
US 2010/0295144 A1    Nov. 25, 2010

(30) Foreign Application Priority Data
Jul. 30, 2007 (GB) .................................. 0714770.5

(51) Int. Cl.
*H01L 21/00* (2006.01)
(52) U.S. Cl.
USPC .. 438/66; 257/443; 257/E27.133; 257/E31.11
(58) Field of Classification Search .............. 438/66; 257/443, E27.133, E31.11
See application file for complete search history.

(56) References Cited

U.S. PATENT DOCUMENTS

| 5,567,248 A | 10/1996 | Chung |
| 6,156,967 A | 12/2000 | Ralph et al. |
| 6,908,856 B2 | 6/2005 | Beyne et al. |
| 2004/0086079 A1 | 5/2004 | Tashiro et al. |

FOREIGN PATENT DOCUMENTS

| GB | 2426576 A | 11/2006 |
| GB | 2447264 | 9/2008 |
| JP | 2001345999 A | 12/2001 |
| JP | 2004119955 | * 4/2004 |
| WO | WO-2006/126027 | 11/2006 |
| WO | WO-2008/052965 | 8/2008 |

OTHER PUBLICATIONS

International Search Report and Written Opinion for International Application No. PCT/GB2008/050641 mailed on Apr. 8, 2009.
Search Report under Section 17 for UK Patent Application No. GB0714770.5, Nov. 23, 2007.

* cited by examiner

*Primary Examiner* — Telly Green
(74) *Attorney, Agent, or Firm* — Goodwin Procter LLP

(57) ABSTRACT

A method is provided of forming a light sensing arrangement for use in a light sensor. The method comprises tiling a plurality of individual light sensing elements on a carrier, each element having a notch formed in an edge thereof, the notch being adapted to provide space, when the elements are tiled together, for an electrical connection to be made between the carrier and a surface of the element arranged to faced away from the carrier. Each element may comprise Silicon Photomultiplier (SPM) circuitry.

15 Claims, 10 Drawing Sheets

Notch and wirebond formation

4 side buttable SPM

SPM Pixel mounted in LTCC carrier substrate/BGA to PCB

Passivation of wirebonds & index matching gels

Cross section through LTCC carrier showing pixels and wirebond formation

Glass Lid assembly

FIG. 8  Tiled Array of SPMSubmodules

Detector Submodule Assembly, where SPMArray submodule is inserted into machined lightguide filled with silicone grease

TILED LIGHT SENSING ARRAY

CROSS-REFERENCE TO RELATED APPLICATIONS

This application is a U.S. National Stage of International Application Serial No. PCT/GB2008/050641, filed Jul. 30, 2008, and claims priority to and the benefit of United Kingdom patent application Serial No. 0714770.5, filed Jul. 30, 2007, the disclosures of which are incorporated herein by reference in their entireties.

TECHNICAL FIELD

The present invention relates to a light sensor.

BACKGROUND

The ability to detect photons, and have accurate information on the magnitude of the flux, its arrival time and duration, is of critical importance to many applications. These range from biology, medicine, communications, environmental monitoring, particle and space physics to general instrumentation.

Each application enforces a different set of requirements on the photodetector element, ranging from high detection efficiency and large area detection to operation in magnetic environments. These requirements result in the many custom detector choices available on the market today ranging from solid state PIN and APD (Avalanche Photodiodes) devices to vacuum based photomultiplier tube (PMT) solutions.

In recent times, the dominance of PMTs is being challenged by the advance of silicon technologies and the development of novel detector devices. One in particular, termed here the Silicon Photomultiplier (SPM), has emerged as a direct competitor to the traditional PMT technology.

SPM devices were first developed in Russia in the mid-80's. Referred to in the literature as SiPM, MRS APD or SSPM, the first actual photodetectors based upon this structure were produced in 1989. The SPM is an extension of the concept of the Geiger-Mode avalanche photodiode (GAPD) which is reported widely in the literature, see for example (a) Z. Y. Sadygov et al., "Avalanche Semiconductor Radiation Detectors", Trans. Nucl. Sci. Vol. 43, No. 3 (1996) 1009; and (b) V. Saveliev, "The Recent Development and Study of Silicon Photomultiplier", Nucl. Instr. Meth. A 535 (2004) 528-532.

An SPM uses an array of photodiodes operating in Geiger mode with integrated quenching elements, summing the electrical output of all the diodes. The net result is a series of pulses (from the diodes that have detected a photon) being added together. As individual diodes detect photons the summed output will increase or decrease. This produces an analogue electrical output which is proportional to the number of photons incident on the total sensor. The gain in this case is still $>10^5$.

Compared with PMTs the technology is highly attractive in offering a low bias voltage, high gain, small form factor product which is not sensitive to magnetics or ambient light.

Despite early developments, the technology has been slow to evolve commercially because of the lack of early manufacturing developments. This has changed dramatically over the last 5 years with the arrival of several manufacturers producing SPM devices in volume.

SPM detector sizes on the market today are currently limited to detection areas of the order to several millimetres square. To compete with PMT, large area detection comparable to the typical PMT area of ~1" (2.5 cm) sizes and greater is required.

The techniques disclosed in WO 2006/126027 allow the tiling of SPM sensor elements into a larger array; this has allowed the production of silicon photomultiplier detectors with an active area of between 1 mm and 3 mm in diameter, for example. For larger areas SPM arrays, a flexible substrate is disclosed in WO 2008/052965, which allows the connection of the top contacts of the SPM arrays and allows the assembly of large numbers of SPM diodes to allow either a summed or pixellated output to be achieved.

In this context, a summed output is provided when multiple detectors are connected together at the output to produce a single larger area detector; when operating in such a mode, the sensor is not capable of imaging and can only detect light incident on it, not distinguish spatial information. On the other hand, a pixellated output is provided when multiple pixels in an array can be addressed and read out individually; when operating in such a mode, the sensor is capable of imaging.

SPM diodes are currently produced in diameters of between 1 mm and 3 mm. However, there is an increasing demand for detectors which are in the order of 1.2 cm in diameter. This can either be accomplished by manufacturing a single large piece of silicon with 1.2 cm diameter, or by tiling together an array of e.g. 3 mm diameter detectors in a 4×4 array (see, for example, WO 2006/126027 and WO 2008/052965). The output for these arrays varies from summed to pixellated and it is necessary to provide a common framework under which both those two concepts can work.

SUMMARY

According to a first aspect of the present invention there is provided a method of forming a light sensing arrangement for use in a light sensor, the method comprising tiling a plurality of individual light sensing elements on a carrier, each element having a notch formed in the element, the notch being adapted to provide space, when the elements are tiled together, for an electrical connection to be made between the carrier and a surface of the element arranged to faced away from the carrier.

Each element may comprise solid-state light sensing circuitry.

Each element may comprise a silicon die.

Each element may comprise Silicon Photomultiplier circuitry.

The notch may be disposed in a corner of the element.

The element and the space provided by the notch may together define a regular shape.

The notch may be adapted to provide space for the electrical connection to be made substantially without the electrical connection protruding outside the bounds of the shape.

The shape may be substantially rectangular.

The shape may be substantially square.

The method may comprise forming a plurality of unit cells, each unit cell comprising the carrier and plurality of elements tiled on the carrier, and keeping the unit cells for subsequent arrangement into an array of unit cells according to customer and/or product requirements.

The method may comprise tiling together the plurality of unit cells to form an array of unit cells.

The method may comprise arranging the elements on the carriers so as to provide minimal dead space between adjacent elements when disposed on different respective unit cells of the array of unit cells.

Each element may comprise high-gain light sensing circuitry.

The gain may be greater than $10^3$.

The gain may be greater than $10^5$.

The method may comprise arranging adjacent elements on the carrier with minimal dead spacing between them.

The method may comprise arranging adjacent elements on the carrier substantially to abut one another.

The active area of each element may extend substantially to the edges of the element.

The method may comprise using substantially planar elements.

The method may comprise forming a tiled arrangement having an overall active area greater than 2 square cm in area.

The method may comprise forming a tiled arrangement having an overall active area greater than 5 square cm in area.

The method may comprise forming a tiled arrangement having an overall active area greater than 10 square cm in area.

The method may comprise forming a plurality of die on a wafer, the die forming the respective elements, and removing material from the wafer to form the notches before dicing the wafer.

The method may comprise removing material by etching.

The method may comprise simultaneously forming the notches for a plurality of die by removing material at a boundary between those die.

The method may comprise dicing the wafer.

The method may comprise aligning the elements on the carrier by use of alignment features provided on the carrier.

The method may comprise providing first and second contacts on the carrier for each element, the first contact for making the electrical connection through the notch to the surface of the element facing away from the carrier, and the second contact for making a further electrical connection to a surface of the element facing the carrier.

The method may comprise making the further electrical connection by use of conductive adhesive epoxy.

The method may comprise making the electrical connection through the notch by use of wire bonding.

The method may comprise minimising the height and/or distance of travel of the wire bond.

The notch may be rectangular shaped.

The notch may be square shaped.

The notch may be formed in an edge of the element.

The method may comprise arranging electrical connections to enable a separate output from each element.

The method may comprise arranging electrical connections to enable a single output for all elements or for a group of elements.

The method may comprise forming a plurality of notches.

The method may comprise forming a notch for each electrical connection required to the surface of the element facing away from the carrier.

According to a second aspect of the present invention there is provided a light sensing element suitable for use in a method according to the first aspect of the present invention. In this respect, each element has a notch formed in an edge thereof, the notch being adapted to provide space, when the elements are tiled together, for an electrical connection to be made between the carrier and a surface of the element arranged to faced away from the carrier.

According to a third aspect of the present invention there is provided a unit cell formed by a method according to the first aspect of the present invention. In this respect, each unit cell comprises the carrier and plurality of light sensing elements tiled on the carrier. The unit cells may be kept for subsequent arrangement into an array of unit cells according to customer and/or product requirements.

According to a fourth aspect of the present invention there is provided a wafer formed by a method according to the first aspect of the present invention. In this respect, a plurality of die are formed on the wafer, the die forming the respective light sensing elements, with material removed from the wafer to form notches before dicing the wafer.

According to fifth to seventh aspects of the present invention there is provided a method, apparatus and system comprising: a submodule to optically couple at least one light source or coupling element to at least one detector element; and an assembly comprising of a tiled array of detector elements coupled to a machined lightguide to provide direct or indirect optical coupling and mounting means to secure and align an optical source or coupling element to detector element.

DETAILED DESCRIPTION

Figure 9:
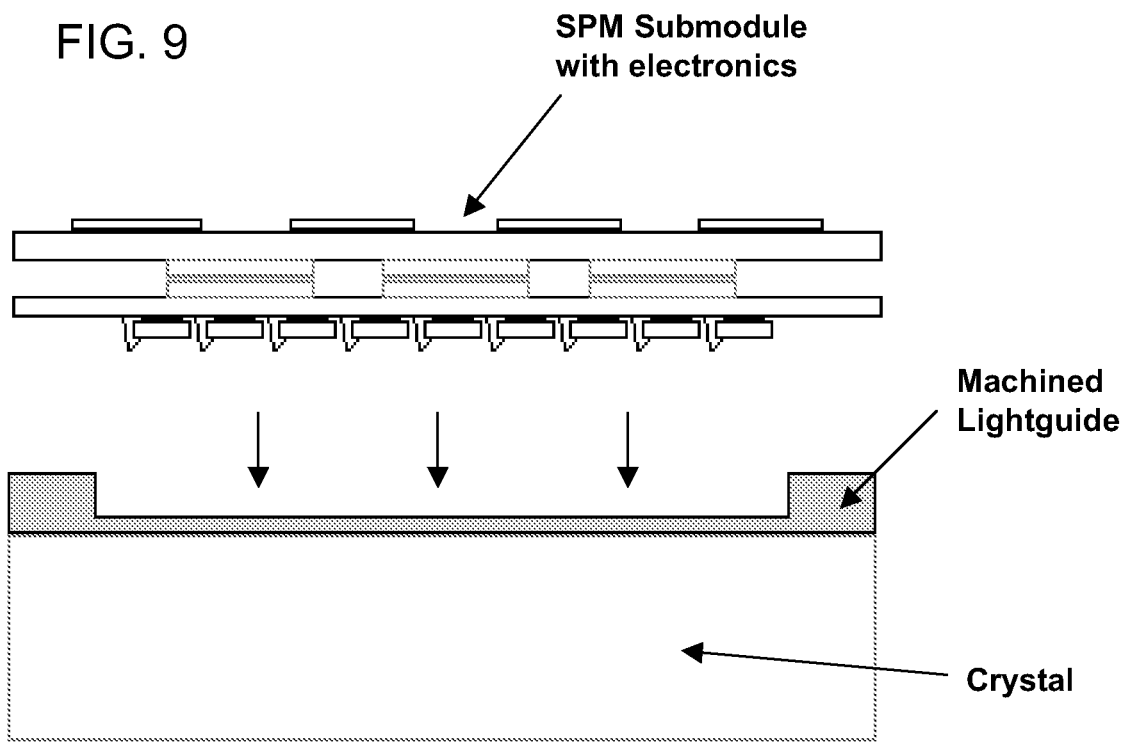

FIG. 9 illustrates a Detector Submodule Assembly: (a) the scintilator/lightguide assembly filled with optical grease; (b) SPM tiled array with electrical board to board interconnection and PCB carrier with ASIC's which is attached to (a). Note a thermal buffer between the ASICs and SPM tiled array is achieved using board to board interconnections.

An embodiment of the present invention addresses the requirements for large area detection based on the tiling of discrete SPM die in a large area array format using hybrid packaging methods. A method of designing a submodule tile which consists of a N×N array of SPM die is disclosed. The detector submodule is designed with minimal deadspace around the edge such that the submodules can be tiled for larger area detection.

This detector submodule has particular application for nuclear medicine where radiological techniques are employed to study body functions (human and small animal) such as metabolism and anatomical features. Current nuclear radiation techniques include Single photon emission computed tomography (SPECT) and Positron Emission Tomography (PET)—small animal & whole body.

The detection area coverage for PET whole body scanner covers ~0.5 m² arranged in an annular ring. This requires the scaling of SPM submodules such that they are tiled together to cover large areas suitable for PET imaging. The most efficient way of imaging is to enclose the patient with a ring of scintillator detectors with each detector in electronic coincidence with those on the opposite side of the patient. When a pair of photon detectors simultaneously detect 511 key energy an annihilation event occurs. PET detection systems comprise of PMTs coupled to a scintillators which are materials that emit visible or near visible light when energy is absorbed from ionising radiation such as gamma rays. Typically scintillator materials include LSO, LYSO, $BaF_2$ and BGO crystals and have been used to count and image radioisotopes when coupled to PMTs.

Using SPM the detection system typically incorporates a ring of submodules where the submodules are butted together on all four sides to scale in detection area. The ability to butt couple to the submodules on all four sides of the submodule with minimal deadspace is termed four side buttable.

Figure 1:
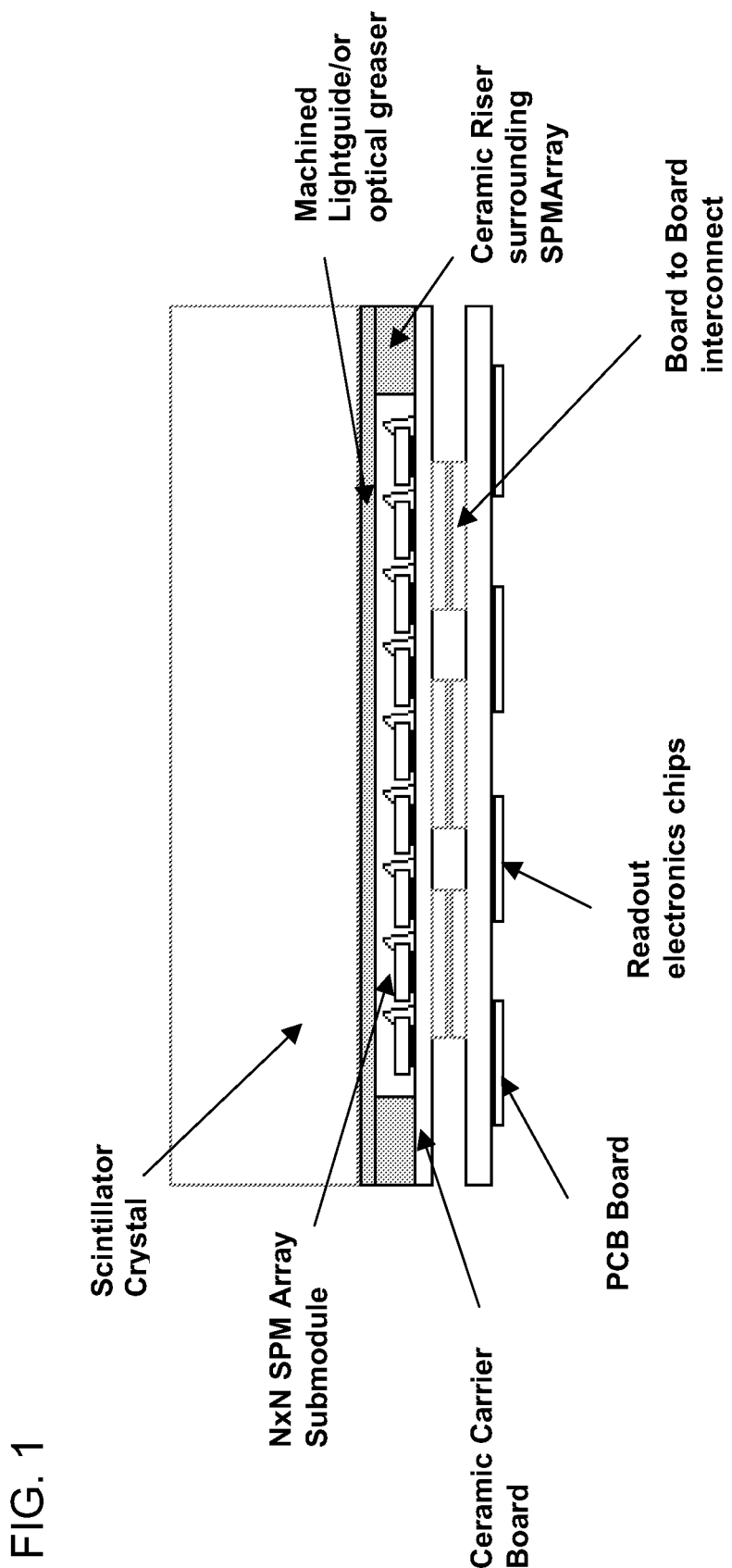
FIG. 1 illustrates a concept for a PET detection module combining scintillator crystal, machined lightguide, SPM tiled array (large area, pixellated), board to board interconnects & pre-amplification board with multichannel readout ASIC chips.

As illustrated in FIG. 1, a submodule configuration is comprised typically of the following elements:
1). A scintillator crystal typically converts annihilation events to visible light energy which is detected by the SPM submodule.
  2). Machined transparent acrylics light guides may be used from materials which acts as a mechanical support/housing for both the crystals and the detection array. The scintillator is coupled to the lightguide using optical grease (silicone).
  3). The SPM on detection of a light pulse generates a corresponding electrical signal. The SPM outputs are transmitted to buffer amplification electronics and data processing for image reconstruction.
  4). Board to board connectors are used to transmit the signal output from the SPM to a PCB board containing multichannel readout circuitry. For effective heat removal from the package due to thermal heat released by the electronics, copper based heat blocks, spheres etc can be mounted on the backside of the ceramic carrier board directly under the die as heat conduits. For temperature stabilisation, embedded eTEC solutions are emerging on the market.

The technique disclosed in WO 2008/052965 provides a solution for situations which require there to be light optically coupled into the detector, for example, from a scintillator or a winstone cone. In those applications, the use of a flexible membrane to connect die into larger arrays is ideal.

Another method of creating arrays is to use a standard die and wire bond to the top of the die. However, this causes problems in that the wirebonding must connect down to the substrate on which the detectors are mounted. The wire bond itself takes up a finite amount of room on the substrate and this limits the compactness of any array made up using this technology.

Figure 2:
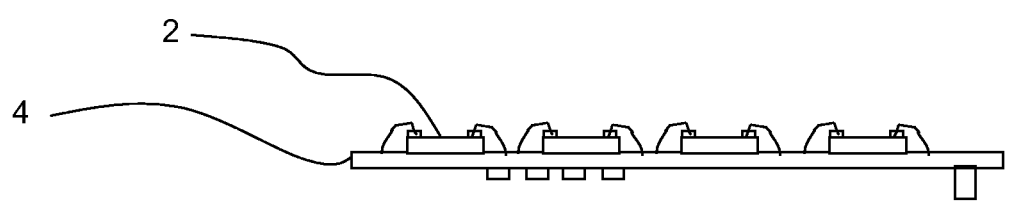
FIG. 2 shows a known configuration for electrical connection of die to a substrate by wire bonds.

This is illustrated in FIG. 2. It can be seen from FIG. 2 that the wire bonds to the side of the die 2 limit the fill factor that the overall array can achieve on the substrate 4. This dead space limits effectiveness of the array at detecting light in the summed instance, and in the pixellated instance it limits the resolution of the array.

An embodiment of the present invention provides a novel approach to scaling SPM die (referred to here as pixels) into large 2D array formats typically 50×50 mm² (~2 inch diameter). In particular, the scaling of SPM pixels in N×M array formats is disclosed for large area detection for summed pixel output and 2D spatial detection where pixels are individually addressed.

To tile large area 2D SPM array requires new high fill factor packaging formats to butt couple SPM pixels on all four sides (four side buttable) with minimal non active, deadspace between pixels (<100 μm) and minimal electrical interconnection area or the ability to allow the electrical connection to the SPM to not interfere with other butt coupled SPM pixels in the array.

The electrical interconnection from the die to the package has many variants including wirebond, flip-chip, tab bonds and surface mount. These are known techniques. The challenge for 2D SPM arrays of pixels is to minimise interconnect deadspace needed for electrical connections from the pixel to the carrier. In the case of wirebonding this represents the wirebond area needed to process a wire loop from the bond pad of the pixel to landing pad/finger located on the carrier.

Other promising interconnect techniques from die to package include through hole silicon vias combined with flip-chip assembly (see e.g. U.S. Pat. No. 6,908,856 which describes a method of manufacturing a through hole via in a semiconductor material). This process has undergone a lot of research in the last decade, but it is still not a commercially viable process for the production of SPM arrays.

WO 2008/052965, mentioned previously, considers an array of detectors arranged in planar format on a perforated thin film flex circuitry. The use of a flexible membrane to connect die into larger arrays is useful to minimise the working distance between the detector and source (e.g. scintillator crystal or light guide). This reduces optical crosstalk and ultimately improves the energy resolution of the system in a TOF-PET system (IEEE Transactions on Nuclear Sciences, NS-46, pp. 474-478, 1999, W. W. Moses, et. al.). WO 2006/126027 and WO 2008/052965, also mentioned previously, disclose the use of a large array of SPM detectors tiled together to provide for a minimum of dead space between active pixels in the array. In an embodiment of the present invention the connection to the substrate is made through the surface of the SPM arranged to face the substrate.

An embodiment of the present invention provides an assembly method to array SPM pixels in a 2D format using post processing of the SPM pixel to allow a 4 side buttable solution using wirebond techniques. Standard wirebond methods such as ball/wedge and wedge/wedge are challenging to butt couple SPM pixels to within 100 μm of pixel separation as this requires precision bonding methods into deep cavities. The cavity depth is governed by thickness of the pixel. Standard approaches to alleviate this problem compromise the pixel pitch in order to bond to the recesses between the pixels where clearance and control becomes no longer an issue. This approach however compromises the buttable requirements of <100 μm deadspace between pixels needed for applications identified in this patent.

An embodiment of the present invention aims to overcomes this limitation with wirebond techniques by post processing the SPM pixel via a three key process steps. Step 1) machining a notch in the SPM pixel to a depth of ~300 microns to accommodate a fine wirebond loop from the detector bondpad to the metal pad located on the carrier. Step 2) involves the grinding back the thickness of the silicon to <200 μm to reduce the cavity and wirebond length. The wafer is then sawn as usual is standard industry practice. The notch is positioned on the corner of the die. This sequence is necessary to avoid the problems inherent in trying to etch completely through a wafer. Step 3) includes wirebonding the notched die to the carrier substrate. The carrier itself can be any multilevel board such as low temperature co-fired ceramic (LTCC). The present invention is not limited to only LTCC substrates but for use on any substrate capable of having the appropriate interconnection from the SPM pixel to the substrate via a notch in the SPM pixel.

The following describes the post processing steps used in an embodiment of the present invention. The SPM needs to have a notch formed in the SPM pixel. This is performed through a several step process. In the preferred embodiment, the notch is first etched in the SPM substrate through known semiconductor fabrication processing steps. The etching process will result in a etch partially through the SPM wafer. The location of the etch will be such that this will not effect the electrical or optical performance of the SPM and is situated in dead space near a standard SPM top contact bond pad. The wafer is then back ground to remove excess material from the back of the SPM wafer. The back grind process will be such that the termination of the grind will result in a hole formed from the top of the SPM wafer to the backside of the SPM wafer. The SPM can then be diced through known semiconductor diceing techniques. SPM pixels are then attached to the leadless carrier using die attach techniques. These include a conductive adhesive die attach process to make electrical contact between the backside of the pixel and metal pad on the carrier.

The pixels are then wire-bonded (typically with gold wire bonds) to bondpad/fingers on the substrate. The wire bond is preferably optimised so that the height of the loop in the wire bond and the wirebond length is minimised so that a minimum notch size is required. This is done to maximise fill factor and to keep minimal vertical spacing on the top of the die is occupied by the bond wire. This allows optical sources to be placed very close to the detector.

There is no gap between the die and the substrate.

Traces from the bondfingers transfer the signals to vias that then carry them to the bottom of the carrier substrate and finally to circular solder pads for Ball Grid Array (BGA) assembly to a printed electronics board.

The pixel array can be over-molded to completely encapsulate the pixels, bondwires and substrate bondpads. A glass lid can be mounted on top of the carrier to hemetically seal the package if required. Similarly a scintillator crystal can be placed on the top of the carrier with a minimum space to the diode. In the case of an open cavity package (no glass) the sidewalls of the package allow protection to the wirebonds when the source is directly mounted onto the package.

Figure 3:
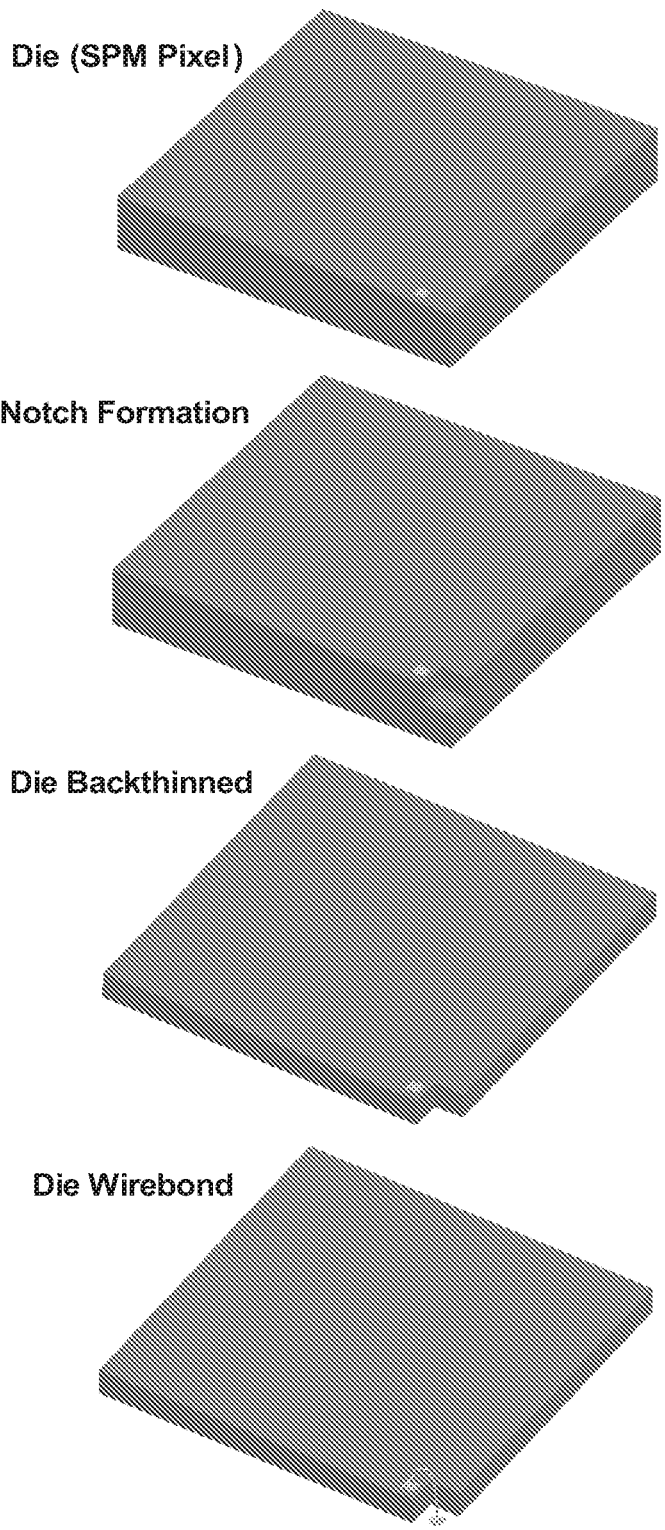
FIG. 3 shows an overall fabrication process according to an embodiment of the present invention the post process machining process steps on the SPM pixel.

To illustrate the above:

FIG. 3 shows an overall fabrication process according to an embodiment of the present invention the post process machining process steps on the SPM pixel.

Figure 4A:
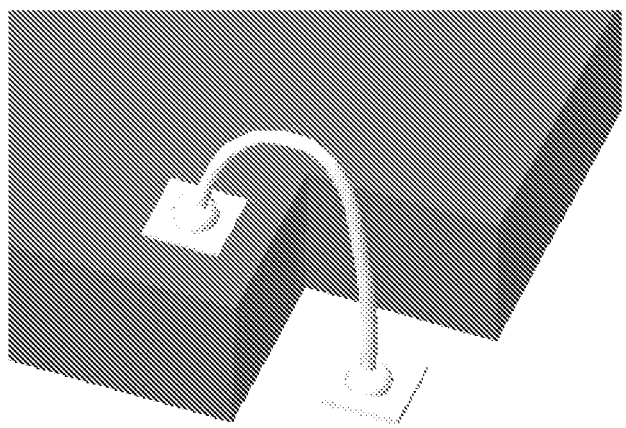
FIG. 4A shows the configuration for electrical connection of die to a substrate carrier by wire bonds at the corner of the SPM Pixel.

FIG. 4A shows the configuration for electrical connection of die to a substrate carrier by wire bonds at the corner of the SPM Pixel.

Figure 4B:
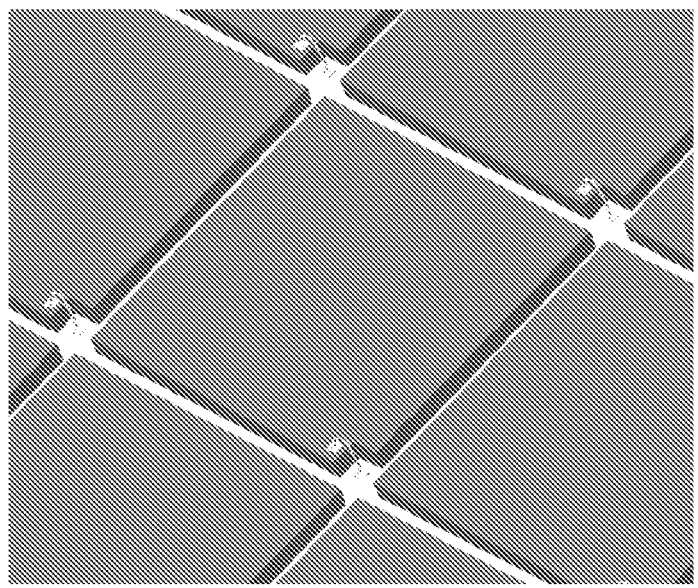
FIG. 4B illustrates a 4 side buttable SPM pixel according to the present invention steps.

FIG. 4B illustrates a 4 side buttable SPM pixel according to the present invention steps.

Figure 5:
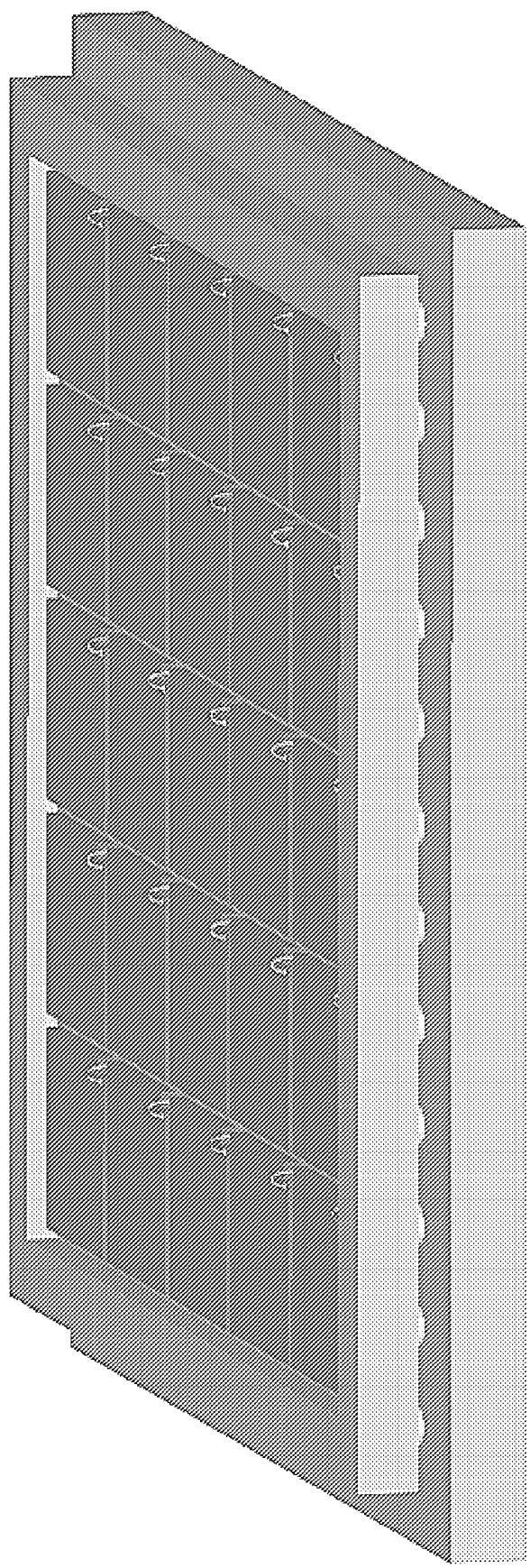
FIG. 5 illustrates a N×M pixel array mounted in a LTCC carrier with ball grid arrays (BGA) for mounting to the printed circuit board.

FIG. 5 illustrates a N×M pixel array mounted in a LTCC carrier with ball grid arrays (BGA) for mounting to the printed circuit board.

Figure 6A:
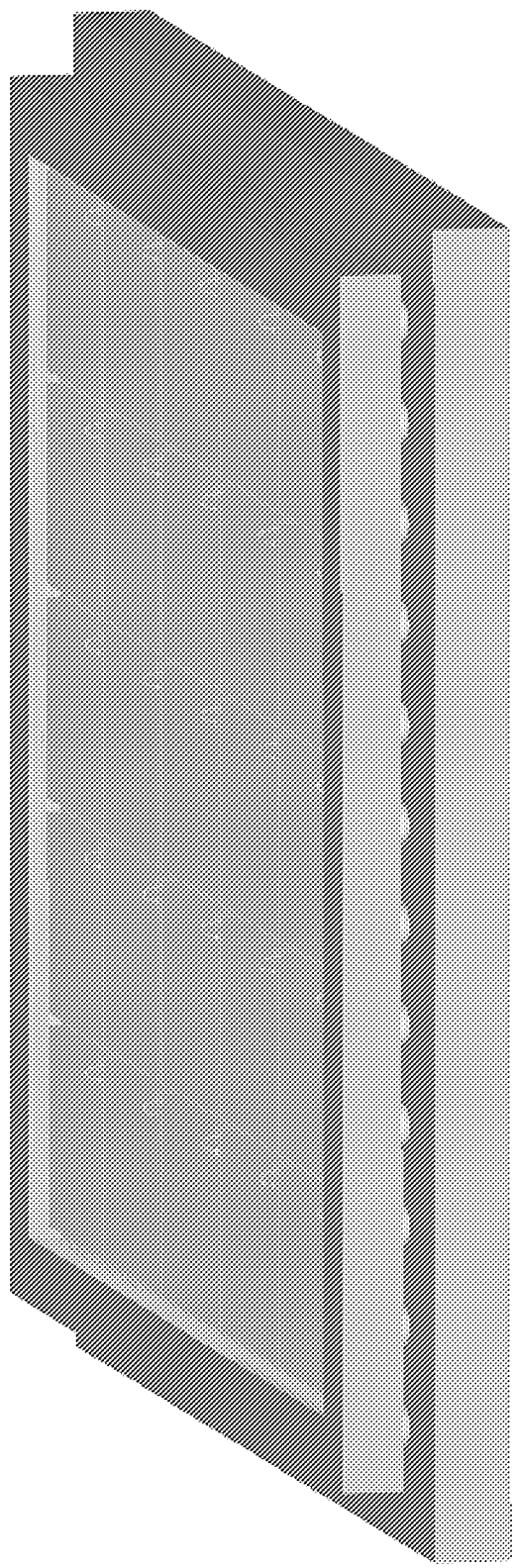
FIG. 6A illustrates a N×M pixel array where the wirebonds have been passivated and the cavity of the LTCC carrier filled with suitable epoxy fill with low thermal expansion co-efficient and high optical transparency.

FIG. 6A illustrates a N×M pixel array where the wirebonds have been passivated and the cavity of the LTCC carrier filled with suitable epoxy fill with low thermal expansion co-efficient and high optical transparency.

Figure 6B:
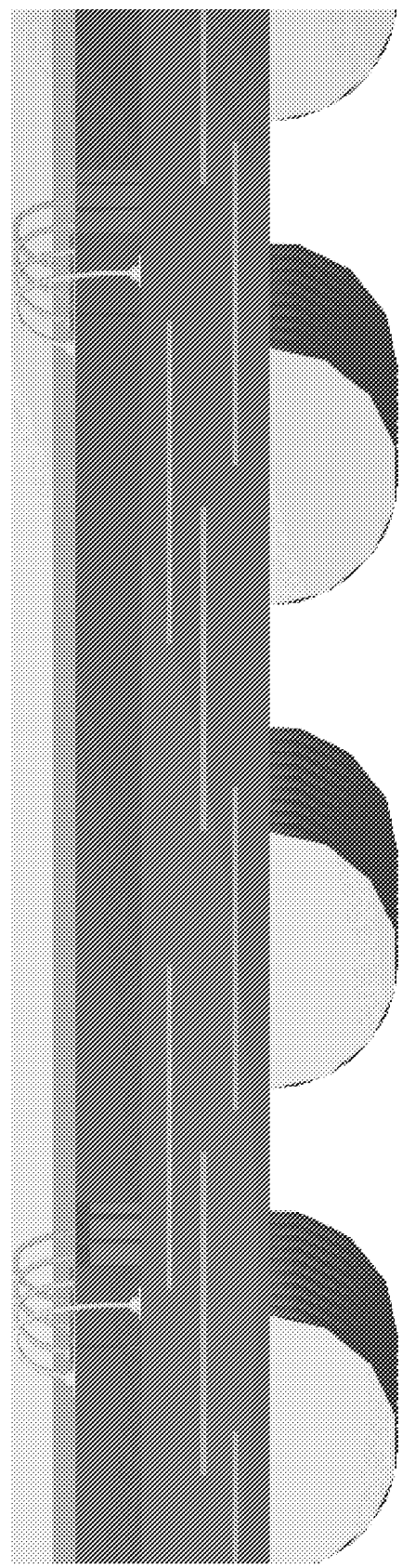
FIG. 6B illustrates a cross section through the N×M pixel array mounted in a multilayer ceramic LTCC package with Ball Grid Arrays.

FIG. 6B illustrates a cross section through the N×M pixel array mounted in a multilayer ceramic LTCC package with Ball Grid Arrays.

Figure 7:
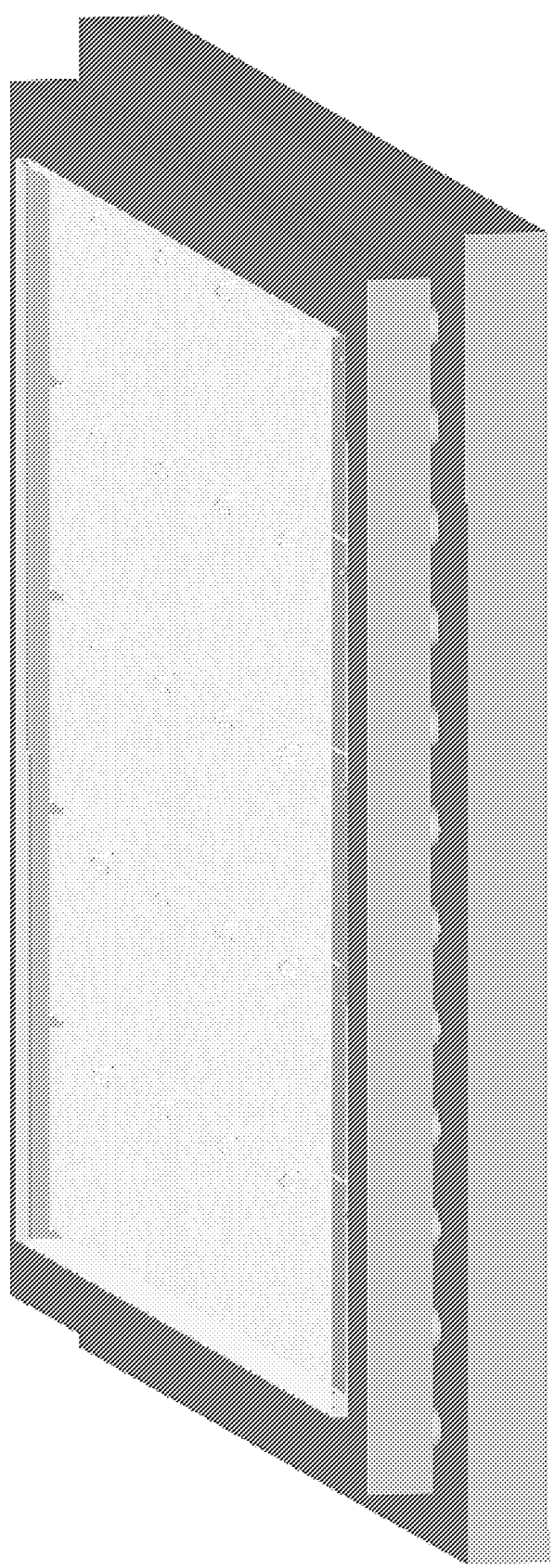
FIG. 7 illustrates an embodiment of FIG. 4 and FIG. 5 where the package is encapsulated with a transparent lid such as glass.

FIG. 7 illustrates an embodiment of FIG. 4 & FIG. 5 where the package is encapsulated with a transparent lid such as glass.

Figure 8:
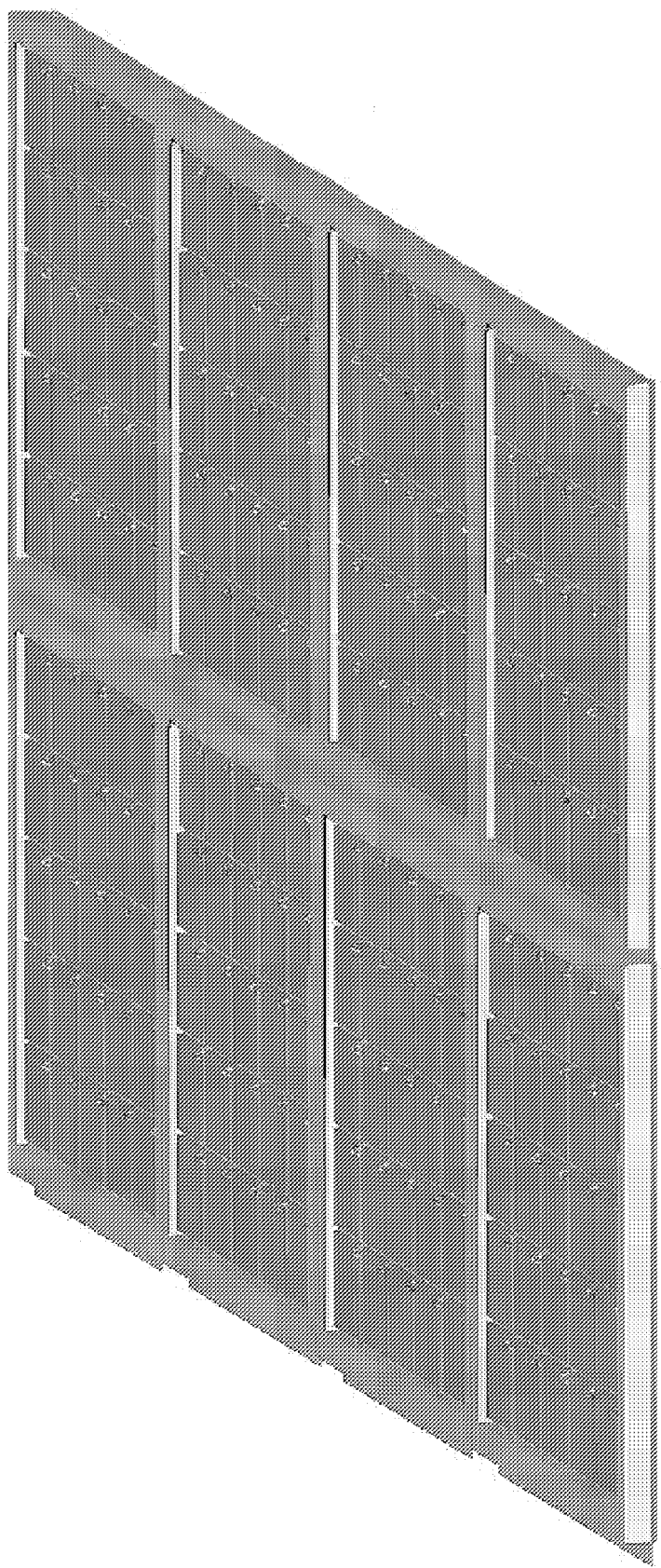
FIG. 8 illustrates the 4 side submodule buttability where submodules are butted together to form large area detection.

FIG. 8 illustrates the 4 side submodule buttability where submodules are butted together to form large area detection.

FIG. 9 illustrates a Detector Submodule Assembly: (a) the scintillator/lightguide assembly filled with optical grease; (b) SPM tiled array with electrical board to board interconnection and PCB carrier with ASIC's which is attached to (a). Note a thermal buffer between the ASICs and SPM tiled array is achieved using boar to board interconnections.

It will be appreciated that an embodiment of the present invention, relating to large-area low-light sensors, finds particular but not exclusive application in the following fields: (a) nuclear medicine, in particular for positron emission tomography (PET) scanning; (b) radiation detection for detecting x-ray photons either through scintillator or through direct conversion of x-ray photons within the silicon; and (c) microscopes which use optics to focus light onto low light detectors. The use of notches as taught above could be used in the manufacture of a type of position sensitive detector as set out in GB 0704206.2 (published as GB2447264).

In situations where the process and materials used overmolding the package size limits to a 4×4, 6×6 array size of 3 mm×3 mm SPM pixels.

It is important for the submodule design to minimize the thermal stress on the die due to CTE (coefficient of thermal expansion) mismatch with the substrate materials (PCB versus ceramic) and stresses in epoxy materials.

Where thermal issues constrain the detection size to <8×8, a solution to the problem is to directly integrate the detector array/readout electronics to the lightguide/crystal such that the lightguide acts as a mechanical support for the crystals as well as an encapsulation lid for the detector array, see FIG. 3. Using this approach a detection submodule where >8×8 units per submodule is feasible.

Specifically, the SPM array is directly assembled to the lightguide which is machined with a cavity where the SPM pixels are potted/immersed in a highly transparent silicone optical grease which infills the cavity. Groove slots in the lightguide allows for excess optical grease to be removed prior to cure. These rubber compounds can be cured at room temperature if allowed to set over several days or accelerated cure cycles can be achieved using elevated temperatures typically between 50 to 150° C. for cure times which range from several hours to 10s of minutes.

an embodiment of the present invention overcomes issues like epoxy coverage and planarisation of the SPM detector arrays in large area. The novel aspect of this relies on the integration of an arrayed wirebond of tile detectors directly to a machined cast acrylic lightguide using optical grease (interface layer) so as to protect the wirebonds.

It is noted that the ceramic or substrate to which the SPM tile array can be machined to provide cavities or precise features they do so at much higher price compared to machining.

The present application claims the benefit of priority from UK Patent Application No. 0714770.5, the entire content of which is hereby incorporated by reference, both for providing support in respect of the claims appended to the present application, and for the purpose of more fully enabling the skilled person to put the present invention into effect.

The invention claimed is:

1. A method of forming a light sensing arrangement for use in a light sensor, the method comprising tiling a plurality of individual light sensing elements side-by-side on a carrier, each element having a notch formed through the element, the notch being adapted to provide space, when the elements are tiled together, for an electrical connection to be made between the carrier and a surface of the element arranged to face away from the carrier.

2. A method as claimed in claim 1, wherein each element comprises solid-state light sensing circuitry; and/or wherein each element comprises a silicon die; and/or wherein each element comprises Silicon Photomultiplier circuitry; and/or wherein each element comprises high-gain light sensing circuitry, for example having a gain greater than $10^3$ or greater than $10^5$.

3. A method as claimed in claim 1, wherein the element and the space provided by the notch together define a regular shape, such as a rectangular or square shape, and wherein the notch is optionally adapted to provide space for the electrical connection to be made substantially without the electrical connection protruding outside the bounds of the shape.

4. A method as claimed in claim 1, comprising forming a plurality of unit cells, each unit cell comprising the carrier and plurality of elements tiled on the carrier, and keeping the unit cells for subsequent arrangement into an array of unit cells.

5. A method as claimed in claim 4, comprising tiling together the plurality of unit cells to form an array of unit cells and/or arranging the elements on the carriers so as to provide minimal dead space between adjacent elements when disposed on different respective unit cells of the array of unit cells.

6. A method as claimed in claim 1, comprising forming a plurality of die on a wafer, the die forming the respective elements, and removing material from the wafer to form the notches before dicing the wafer.

7. A method as claimed in claim 6, comprising: removing material by etching, laser ablation, sawing or any other appropriate means; and/or simultaneously forming the notches for a plurality of die by removing material at a boundary between those die; and/or dicing the wafer.

8. A method as claimed in claim 1, comprising aligning the elements on the carrier by use of alignment features provided on the carrier.

9. A method as claimed in claim 1, comprising providing first and second contacts on the carrier for each element, the first contact for making the electrical connection through the notch to the surface of the element facing away from the carrier, and the second contact for making a further electrical connection to a surface of the element facing the carrier, and optionally comprising making the further electrical connection by use of conductive adhesive epoxy.

10. A method as claimed in claim 1, comprising: making the electrical connection through the notch by use of wire bonding; and/or minimising the height and/or distance of travel of the wire bond; and/or arranging adjacent elements on the carrier with minimal dead spacing between them; and/or arranging adjacent elements on the carrier substantially to abut one another; and/or using substantially planar elements; and/or forming a tiled arrangement having an overall active area greater than 1 square cm in area, for example greater than 5 square cm in area and/or greater than 10 square cm in area; and/or arranging electrical connections to enable a separate output from each element; and/or arranging electrical connections to enable a single output for all elements or for a group of elements.

11. A method as claimed in claim 1, wherein the notch is rectangular shaped; and/or wherein the notch is square shaped; and/or wherein the notch is disposed in a corner of the element; and/or wherein the notch is formed in an edge of the element; and/or; and/or wherein the active area of each element extends substantially to the edges of the element.

12. A method as claimed in claim 1, comprising forming a plurality of notches, and optionally forming a notch for each electrical connection required to the surface of the element facing away from the carrier.

13. A light sensing element suitable for use in a method as claimed in claim 1.

14. A unit cell formed by a method as claimed in claim 4.

15. A wafer formed by a method as claimed in claim 6.

* * * * *